United States Patent
Long et al.

(10) Patent No.: US 11,227,523 B2
(45) Date of Patent: Jan. 18, 2022

(54) ARRAY SUBSTRATE, DRIVING METHOD THEREOF, DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Yue Long, Beijing (CN); Tingliang Liu, Beijing (CN); Weiyun Huang, Beijing (CN); Haigang Qing, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 481 days.

(21) Appl. No.: 16/312,521

(22) PCT Filed: Mar. 28, 2018

(86) PCT No.: PCT/CN2018/080898
§ 371 (c)(1),
(2) Date: Dec. 21, 2018

(87) PCT Pub. No.: WO2019/001043
PCT Pub. Date: Jan. 3, 2019

(65) Prior Publication Data
US 2021/0225233 A1 Jul. 22, 2021

(30) Foreign Application Priority Data
Jun. 30, 2017 (CN) .......................... 201710523561.3

(51) Int. Cl.
*G09G 3/20* (2006.01)

(52) U.S. Cl.
CPC ....... *G09G 3/20* (2013.01); *G09G 2310/0202* (2013.01); *G09G 2310/0267* (2013.01);
(Continued)

(58) Field of Classification Search
CPC ............. G09G 3/20; G09G 2310/0202; G09G 2310/0267; G09G 2310/0275;
(Continued)

(56) References Cited

U.S. PATENT DOCUMENTS 9,184,181 B2  11/2015  Lee et al.
2013/0087791 A1  4/2013  Wu et al.
(Continued)

FOREIGN PATENT DOCUMENTS

CN  101226312  7/2008
CN  103033997  4/2013
(Continued)

OTHER PUBLICATIONS

International Search Report from PCT/CN2018/080898 dated Jul. 4, 2018 along with English translated Written Opinion.
Office action from Chinese Application No. 201710523561.3 dated Mar. 4, 2019.

*Primary Examiner* — Gene W Lee
(74) *Attorney, Agent, or Firm* — Calfee, Halter & Griswold LLP

(57) ABSTRACT

An array substrate, a driving method thereof, and a display device are provided. The array substrate comprises a display area and a peripheral area. The display area includes a plurality of gate lines extending in a first direction and a plurality of data lines extending in a second direction. The peripheral area includes a source driver on a side of the peripheral area along the second direction. The display area includes an opening, a first display area on a side of the opening away from the source driver, and a second display area adjacent to the first display area along the first direction.

(Continued)

Data lines in the first display area are connected in one-to-one correspondence with data lines in the second display area, and gate lines in the first display area and gate lines in the second display area are disconnected from each other.

17 Claims, 1 Drawing Sheet

(52) U.S. Cl.
CPC ............... *G09G 2310/0275* (2013.01); *G09G 2310/0281* (2013.01); *G09G 2310/0283* (2013.01)

(58) Field of Classification Search
CPC ... G09G 2310/0281; G09G 2310/0283; G09G 2300/0426
See application file for complete search history.

(56) References Cited

U.S. PATENT DOCUMENTS

| | | |
|---|---|---|
| 2014/0098319 A1 | 4/2014 | Jeon et al. |
| 2014/0197428 A1 | 7/2014 | Wang et al. |
| 2016/0335955 A1 | 11/2016 | Cho et al. |
| 2017/0092219 A1* | 3/2017 | Ooishi ................. G09G 3/3696 |
| 2017/0372661 A1* | 12/2017 | Gu ...................... H01L 27/3276 |

FOREIGN PATENT DOCUMENTS

| | | |
|---|---|---|
| CN | 103258477 | 8/2013 |
| CN | 103713431 | 4/2014 |
| CN | 106157883 | 11/2016 |
| CN | 107104113 | 8/2017 |

* cited by examiner

ARRAY SUBSTRATE, DRIVING METHOD THEREOF, DISPLAY DEVICE

RELATED APPLICATION

The present application is the U.S. national phase entry of PCT/CN2018/080898, with an international filing date of Mar. 28, 2018, which claims the benefit of Chinese Patent Application No. 201710523561.3, filed on Jun. 30, 2017, the entire disclosure of which is incorporated herein by reference.

FIELD

The present disclosure relates to the field of display technologies, and specifically to an array substrate, a driving method thereof, and a display device.

BACKGROUND

In flexible display devices, the effect of a narrow bezel can be achieved using an edge bending technique. However, current mainstream mobile products are provided with openings for components such as a camera and an earpiece on the front of the display device. Since the edge bending technique cannot thoroughly handle the openings, a surface of the display device still needs to leave a large bezel area for these openings. Consequently, a design of a completely borderless display device cannot be realized.

SUMMARY

An aspect of the present disclosure provides an array substrate comprising a display area and a peripheral area surrounding the display area, wherein the display area includes a plurality of gate lines extending in a first direction and a plurality of data lines extending in a second direction, the first direction intersecting the second direction; the peripheral area includes a source driver on a side of the peripheral area along the second direction; the display area includes an opening, a first display area on a side of the opening away from the source driver, and a second display area adjacent to the first display area along the first direction; data lines in the first display area are connected in one-to-one correspondence with data lines in the second display area; and gate lines in the first display area and gate lines in the second display area are disconnected from each other.

According to some exemplary embodiments of the present disclosure, the peripheral area further includes connection lines, the connection lines being configured to connect the data lines in the first display area and the data lines in the second display area in one-to-one correspondence.

According to some exemplary embodiments of the present disclosure, the display area further includes a third display area adjacent to the opening along the first direction, the data lines in the second display area running through the third display area.

According to some exemplary embodiments of the present disclosure, the display area includes two second display areas and two third display areas, the two second display areas being disposed on two sides of the first display area respectively, the two third display areas being disposed on two sides of the opening respectively. The display area further includes a fourth display area on a side of the opening close to the source driver, and fifth display areas on two sides of the fourth display area. Gate lines in the fourth display area run through the fifth display areas, and the data lines in the second display areas run through the third display area and the fifth display areas.

According to some exemplary embodiments of the present disclosure, the data lines in the first display area are connected in one-to-one correspondence with data lines in a same second display area.

According to some exemplary embodiments of the present disclosure, a portion of the data lines in the first display area are connected in one-to-one correspondence with data lines in one second display area, and other data lines in the first display area are connected in one-to-one correspondence with data lines in the other second display area.

According to some exemplary embodiments of the present disclosure, the peripheral area further includes a first gate driver on a side of the display area along the first direction, the gate lines in the first display area and the second display area being connected to the first gate driver.

According to some exemplary embodiments of the present disclosure, the peripheral area further includes a first gate driver and a second gate driver disposed on two sides of the display area respectively along the first direction, the gate lines in the first display area being connected to the first gate driver, the gate lines in the second display area being connected to the second gate driver.

According to some exemplary embodiments of the present disclosure, the peripheral area further includes a first gate driver on a side of the display area along the first direction, gate lines in the first display area, the second display areas, the third display areas, the fourth display area, and the fifth display areas being connected to the first gate driver.

According to some exemplary embodiments of the present disclosure, the peripheral area further includes a first gate driver and a second gate driver disposed on a first side and a second side of the display area respectively along the first direction. One end of each gate line in the first display area close to the first side is connected to the first gate driver, and the other end of the gate line in the first display close to the second side is connected to the second gate driver. Gate lines in the second display area, the third display area, and the fifth display area close to the first side are connected to the first gate driver, and gate lines in the second display area, the third display area, and the fifth display area close to the second side are connected to the second gate driver.

According to some exemplary embodiments of the present disclosure, the opening is configured to accommodate a functional component.

According to some exemplary embodiments of the present disclosure, the functional component is selected from a group comprising a camera and an earpiece.

Another aspect of the present disclosure provides a driving method for any of the array substrates described above, comprising: providing a scan signal row by row to the gate lines in the second display area, and providing a data signal to the data lines in the second display area; and providing a scan signal row by row to the gate lines in the first display area, and providing a data signal to the data lines in the first display area via the data lines in the second display area.

According to some exemplary embodiments of the present disclosure, the display area further includes a third display area adjacent to the opening along the first direction, the data lines in the second display area running through the third display area. The driving method further comprises providing a scan signal row by row to gate lines in the third display area and providing a data signal to data lines in the third display area.

According to some exemplary embodiments of the present disclosure, the display area includes two second display areas and two third display areas, the two second display areas being disposed on two sides of the first display area respectively, the two third display areas being disposed on two sides of the opening respectively. The display area further includes a fourth display area on a side of the opening close to the source driver, and fifth display areas on two sides of the fourth display area. Gate lines in the fourth display area run through the fifth display areas, and the data lines in the second display areas run through the third display area and the fifth display areas.

The driving method comprises: providing a scan signal row by row to the gate lines in the second display areas, the third display areas, the fourth display area and the fifth display areas, and providing a data signal to the data lines in the second display areas, the third display areas, the fourth display area and the fifth display areas; and providing a scan signal row by row to the gate lines in the first display area, and providing a data signal to the data lines in the first display area via the data lines in the second display areas.

A further aspect of the present disclosure provides a display device comprising any of the array substrates described above.

BRIEF DESCRIPTION OF THE DRAWINGS

These and other features of the general inventive concept will become better understood with regard to the following description and accompanying drawings in which.

DETAILED DESCRIPTION

To enable those skilled in the art to better understand the technical solution of the present disclosure, the present disclosure will be further described in detail below in conjunction with the accompanying drawings and specific exemplary embodiments.

As used herein, the term "driver", "chip", "source driver" and like terms will be understood by one of ordinary skill in the art to mean electronic circuitry that provides electrical signals to the display device.

An exemplary embodiment of the present disclosure provides an array substrate suitable for flexible and borderless display, comprising a display area and a peripheral area surrounding the display area. The display area includes a plurality of gate lines extending in a first direction and a plurality of data lines extending in a second direction, the first direction intersecting the second direction. The peripheral area includes source drivers located on a side of the peripheral area along the second direction. The display area includes an opening, a first display area on a side of the opening away from a source driving chip, and a second display area adjacent to the first display area along the first direction. Data lines located in the first display area are connected in one-to-one correspondence with data lines located in the second display area, and gate lines located in the first display area and gate lines located in the second display area are disconnected from each other.

Since the array substrate in this exemplary embodiment has an opening for accommodating a functional component in the display area, when the array substrate is applied to a display panel, the peripheral area thereof may be bent to realize the design of a borderless display panel.

The structure of the array substrate in this exemplary embodiment will be described below with reference to the drawings.

Figure 1:
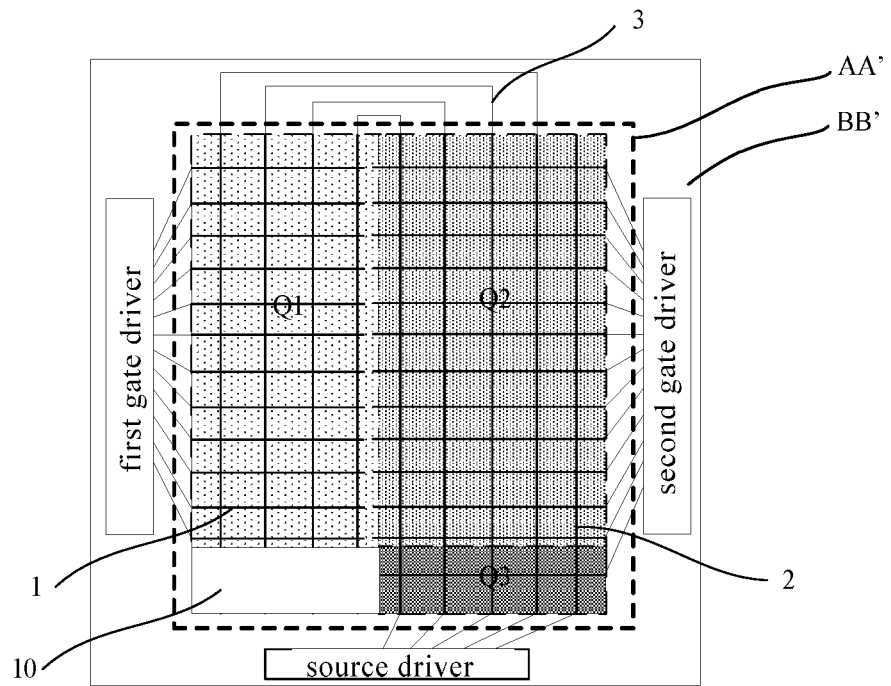
FIG. 1 is a schematic view of an array substrate according to an exemplary embodiment of the present disclosure.

As shown in FIG. 1, an exemplary embodiment of the present disclosure provides an array substrate comprising a display area AA' and a peripheral area BB' surrounding the display area AA'. The display area AA' includes gate lines 1 extending in a first direction, data lines 2 extending in a second direction, and an opening 10. The first direction intersects the second direction (in particular, perpendicular to each other). As is known to those skilled in the art, the extending directions of the gate lines 1 and the data lines 2 intersect each other, and one pixel unit is defined at each intersection. The gate line 1 is connected to a control terminal of a switching transistor of a respective pixel unit so as to control turn-on and turn-off of the respective pixel unit by means of a gate driving signal provided by a gate driver. The data line 2 is connected to a pixel electrode of the pixel unit via a switching transistor of a respective pixel unit so as to write a data signal provided by a source driver to the pixel unit when the pixel unit is turned on, thereby realizing an image display.

The peripheral area BB' includes a source driver disposed on a side of the peripheral area BB' along the second direction, and a gate driver disposed on a side of the peripheral area BB' along the first direction. As shown in FIG. 1, the display area AA' includes a first display area Q1, a second display area Q2, and a third display area Q3. The first display area Q1 is located on a side of the opening 10 away from the source driver. In the first direction, the second display area Q2 is adjacent to the first display area Q1, and the third display area Q3 is adjacent to the opening 10.

Since the opening 10 is disposed in the display area AA' of the array substrate in this exemplary embodiment, gate lines 1 and data lines 2 are not disposed at the position of the opening 10, and data lines 2 located in the first display area Q1 cannot be directly connected to the source driver to receive data signals from the source driver. Therefore, the data lines 2 located in the first display area Q1 are connected in one-to-one correspondence with data lines 2 located in the second display area Q2. Since the data lines 2 located in the first display area Q1 are connected in one-to-one correspondence with the data lines 2 located in the second display area Q2, in order to provide different data signals to pixel units located in the first display area Q1 and pixel units located in the second display area Q2 which are connected to the mutually connected data lines, the gate lines 1 located in the first display area Q1 and the gate lines 1 located in the second display area Q2 need to be disconnected from each other and optionally connected to different gate drivers so as to turn on the pixels units located in the first display area Q1 and the pixel units located in the second display area Q2 at different times, and write data signals into the turned-on pixel units. The data lines 2 located in the second display area Q2 run through the third display area Q3, that is, one data line 2 runs through both the second display area Q2 and the third display area Q3.

Ends of the data lines 2 located in the first display area Q1 away from the source drivers may be connected in one-to-one correspondence with ends of the data lines 2 located in the second display area Q2 away from the source drivers via connection lines 3 located in the peripheral area BB'. Ends of the data lines 2 located in the second display area Q2 (or the third display area Q3) close to the source drivers are connected to the source driver.

In order to further simplify the wiring and reduce the design complexity, bilateral driving may be employed in this exemplary embodiment. That is, a gate driver—a first gate driver and a second gate driver—is disposed respectively on two sides of the peripheral area BB' which are close to the first display area Q1 and the second display area Q2 along the first direction. In this case, the gate lines 1 located in the first display area Q1 closer to the first gate driver are connected to the first gate driver, and the gate lines 1 located in the second display area Q2 and the third display area Q3 closer to the second gate driver are connected to the second gate driver.

Accordingly, an exemplary embodiment of the present disclosure provides a driving method for the array substrate as shown in FIG. 1.

The driving method comprises performing, by the first gate driver, scanning row by row on the gate lines 1 located in the first display area Q1, and providing data signals to the data lines 2 located in the first display area Q1 by the source driver and the data lines 2 located in the second display area Q2, so as to write the data signals into the pixel units located in the first display area Q1 row by row.

The driving method further comprises performing, by the second gate driver, scanning row by row on the gate lines 1 located in the second display area Q2 and the third display area Q3, and providing data signals to the data lines 2 located in the second display area Q2 and the third display area Q3 by the source driver, so as to write the data signals into the pixel units located in the second display area Q2 and the third display area Q3 row by row.

It is to be noted that the driving method for an array substrate provided by an exemplary embodiment of the present disclosure is not limited to the order described above, but may be performed in a reverse order.

Although in the above exemplary embodiment, the opening 10 is located in an edge region of the display area AA', in other exemplary embodiments, the opening 10 may also be located in a non-edge region of the display area AA' and surrounded by the display area.

Figure 2:
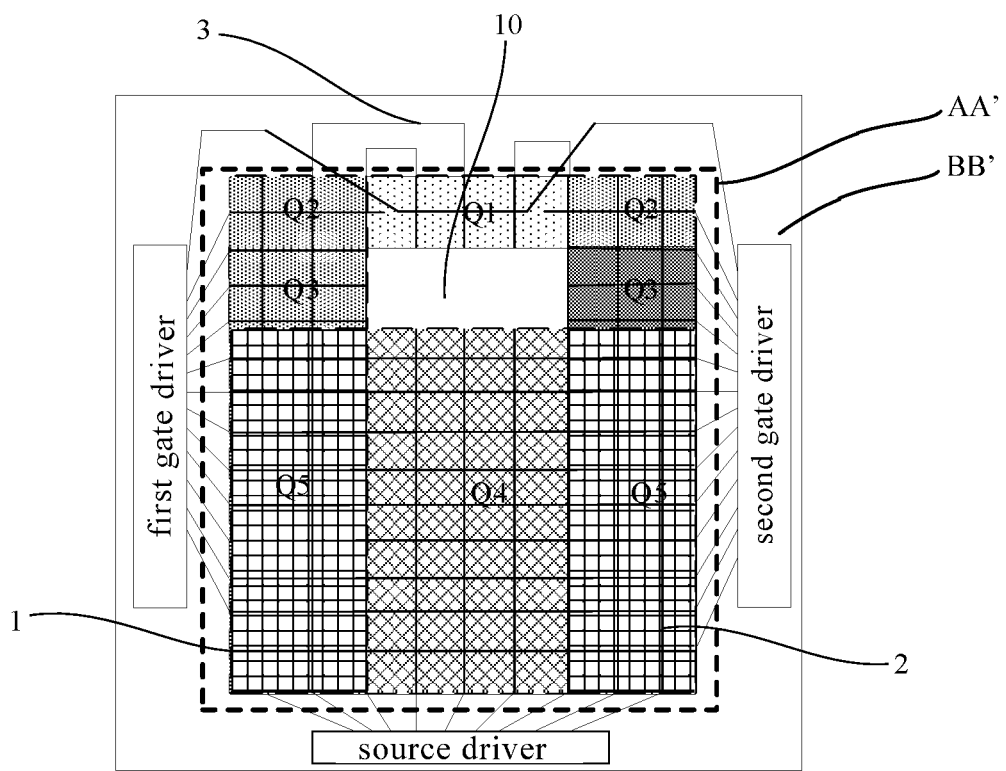
FIG. 2 is a schematic view of an array substrate according to another exemplary embodiment of the present disclosure.

FIG. 2 illustrates a schematic view of an array substrate according to another exemplary embodiment of the present disclosure. As shown in FIG. 2, the array substrate comprises a display area AA' and a peripheral area BB' surrounding the display area AA'. The display area AA' includes gate lines 1 extending in a first direction, data lines 2 extending in a second direction, and an opening 10. The first direction intersects the second direction (in particular, perpendicular to each other).

The peripheral area BB' includes a source driver disposed on a side of the peripheral area BB' along the second direction, and a first gate driver and a second gate driver disposed on two sides of the peripheral area BB' along the first direction. As shown in FIG. 2, the display area AA' includes a first display area Q1, two second display areas Q2, two third display areas Q3, a fourth display area Q4, and two fifth display areas Q5. The first display area Q1 is located on a side of the opening 10 away from the source driver. In the first direction, the two second display areas Q2 are disposed on two sides of the first display area Q1. In the first direction, the two third display areas Q3 are disposed on two sides of the opening 10. The fourth display area Q4 is located on a side of the opening 10 close to the source driver. In the first direction, the two fifth display areas Q5 are disposed on two sides of the fourth display area Q4.

Since the opening 10 is disposed in the display area AA' of the array substrate in this exemplary embodiment, gate lines 1 and data lines 2 are not disposed at the position of the opening 10, and data lines 2 located in the first display area Q1 cannot be directly connected to the source driver to receive data signals from the source driver. Therefore, the data lines 2 located in the first display area Q1 are connected in one-to-one correspondence with data lines 2 located in the second display areas Q2. For example, some of the data lines 2 located in the first display area Q1 may be connected in one-to-one correspondence with the data lines 2 in the second display area Q2 on the left side, and other data lines 2 located in the first display area Q1 are connected in one-to-one correspondence with the data lines 2 in the second display area Q2 on the right side, as shown in FIG. 2. Alternatively, the data lines 2 located in the first display area Q1 may be connected in one-to-one correspondence with the data lines located in the same second display area Q2 (for example, the left second display area Q2 or the right second display area Q2).

Since the data lines 2 located in the first display area Q1 are connected in one-to-one correspondence with the data lines 2 located in the second display areas Q2, in order to provide different data signals to pixel units located in the first display area Q1 and pixel units located in the second display areas Q2 which are connected to the mutually connected data lines, the gate lines 1 located in the first display area Q1 and the gate lines 1 located in the second display areas Q2 need to be disconnected from each other and connected to different gate drivers so as to turn on the pixels units located in the first display area Q1 and the pixel units located in the second display areas Q2 at different times, and write data signals into the turned-on pixel units. The data lines 2 located in the second display area Q2 run through the third display area Q3 and the fifth display area Q5 on the same side, that is, one data line 2 runs through the second display area Q2, the third display area Q3, and the fifth display area Q5. In addition, one gate line 1 runs through the fifth display areas Q5 on two sides and the fourth display area Q4 in the middle.

Ends of the data lines 2 located in the first display area Q1 away from the source driver may be connected in one-to-one correspondence with ends of the data lines 2 located in the second display areas 2 away from the source driver via connection lines 3 located in the peripheral area BB'. Ends of the data lines 2 located in the second display areas Q2 (or the third display areas Q3, the fifth display areas Q5) close to the source driver are connected to the source driver.

In order to further simplify the wiring and reduce the design complexity, bilateral driving may be employed in this exemplary embodiment. That is, a gate driver—a first gate driver and a second gate driver—is disposed respectively on two sides of the peripheral area BB' which are close to the first display area Q1 and the second display area Q2 along the first direction. In this case, ends of the gate lines 1 located in the first display area Q1 closer to the first gate driver are connected to the first gate driver, and ends of the gate lines 1 located in the first display area Q1 closer to the second gate driver are connected to the second gate driver so as to turn on and turn off the pixel units in the first display area Q1 under the control of both the first gate driver and the second gate driver. Alternatively, the gate lines 1 located in the first display area Q1 may be connected only to one of the first gate driver and the second gate driver so as to turn on and turn off the pixel units in the first display area Q1 under the control of the connected gate driver. The gate lines 1 located in the second display area Q2 on the left side of the first display area Q1 are connected to the first gate driver located on the left side in FIG. 2, and the gate lines 1 located in the second display area Q2 on the right side of the first display area Q1 are connected to the second gate driver located on the right side in FIG. 2. Similarly, the gate lines 1 located in the third display area Q3 on the left side of the opening 10 are connected to the first gate driver located on the left side in FIG. 2, and the gate lines 1 located in the third display area Q3 on the right side of the opening 10 are connected to the second gate driver located on the right side in FIG. 2. For the gate lines 1 running through the fourth display area Q4 and the two fifth display areas Q5, one end of each gate line may be connected to the first gate driver, and the other end thereof is connected to the second gate driver, as shown in FIG. 2, so as to turn on and turn off the pixel units in the fourth display area Q4 and the two fifth display areas Q5 under the control of both the first gate driver and the second gate driver. Alternatively, the gate lines 1 running through the fourth display area Q4 and the two fifth display areas Q5 may be connected only to one of the first gate driver and the second gate driver so as to turn on and turn off the pixel units in the fourth display area Q4 and the two fifth display areas Q5 under the control of the connected gate driver.

Accordingly, an exemplary embodiment of the present disclosure further provides a driving method for the array substrate shown in FIG. 2. The driving method comprises performing, by the first gate driver and/or the second gate driver, scanning row by row on the gate lines 1 located in the first display area Q1, and provide data signals to the data lines 2 located in the first display area Q1 by the source driver and the data lines 2 located in the second display area Q2, so as to write the data signals into the pixel units located in the first display area Q1 row by row.

The driving method further comprises performing, by the first gate driver, scanning row by row on the gate lines 1 located in the second display area Q2 on the left side of the array substrate and the third display area Q3, and provide data signals to the data lines 2 located in the second display area Q2 on the left side of the array substrate and the third display area Q3 by the source driver, so as to write the data signals into the pixel units located in the second display area Q2 on the left side of the array substrate and the third display area Q3 row by row; and performing, by the second gate driver, scanning row by row on the gate lines 1 located in the second display area Q2 on the right side of the array substrate and the third display area Q3, and provide data signals to the data lines 2 located in the second display area Q2 on the right side of the array substrate and the third display area Q3 by the source driver, so as to write the data signals into the pixel units located in the second display area Q2 on the right side of the array substrate and the third display area Q3 row by row.

Further, the driving method comprises performing, by the first gate driver and/or the second gate driver, scanning row by row on the gate lines 1 located in the fourth display area Q4 and the fifth display areas Q5, and provide data signals to the data lines 2 located in the fourth display area Q4 and the fifth display areas Q5 by the source driver, so as to write the data signals into the pixel units located in the fourth display area Q4 and the fifth display areas Q5 row by row.

In the above exemplary embodiment, when the gate lines 1 located in the first display area Q1, the fourth display area Q4 and the fifth display areas Q5 are connected to both the first gate driver and the second gate driver, charging rate of the pixel units located in the first display area Q1, the fourth display area Q4 and the fifth display areas Q5 is increased, thereby making display effect of the array substrate more excellent. Of course, in an alternative exemplary embodiment, all of the gate lines in the display area may be connected to the same gate driver.

It is to be noted that the driving method for an array substrate provided by an exemplary embodiment of the present disclosure is not limited to the order described above, but may be performed in other orders.

A further exemplary embodiment of the present disclosure provides a display device comprising any of the array substrates described above. In particular, the display device can achieve borderless display by means of an edge bending technique.

Specifically, the display device may be any product or component having a display function, such as a mobile phone, a tablet computer, a television, a display, a notebook computer, a digital photo frame, a navigator, and the like.

Of course, as will be readily understood by those skilled in the art, the display device provided by an exemplary embodiment of the present disclosure may further include other conventional structures, such as a power supply unit, a display driving unit, and the like, and therefore, such details are not described herein.

It can be understood that the above exemplary embodiments are exemplary embodiments used only for illustrating the principle of the present disclosure, and that the present disclosure is not so limited. Various variations and improvements may be made by those ordinarily skilled in the art without departing from the spirit and essence of the present disclosure. These variations and improvements are regarded as falling within the scope of the present disclosure.

The invention claimed is:

1. An array substrate comprising a display area and a peripheral area surrounding the display area,
    wherein the display area includes a plurality of gate lines extending in a first direction and a plurality of data lines extending in a second direction, the first direction intersecting the second direction;
    wherein the peripheral area includes a source driver on a side of the peripheral area along the second direction;
    wherein the display area comprises an opening, a first display area on a side of the opening away from the source driver, and a second display area adjacent to the first display area along the first direction;
    wherein data lines in the first display area are connected in one-to-one correspondence with data lines in the second display area;
    wherein gate lines in the first display area and gate lines in the second display area are disconnected from each other, and
    wherein the peripheral area further comprises a first gate driver and a second gate driver disposed on a first side and a second side of the display area respectively along the first direction, the gate lines in the first display area are connected to the first gate driver, and the gate lines in the second display area are connected to the second gate driver.

2. The array substrate according to claim 1, wherein the peripheral area further comprises connection lines, the connection lines are configured to connect the data lines in the first display area and the data lines in the second display area in one-to-one correspondence.

3. The array substrate according to claim 1, wherein the display area further comprises a third display area adjacent to the opening along the first direction, the data lines in the second display area running through the third display area.

4. The array substrate according to claim 3, wherein the second display area comprises a first part and a second part and the third display area comprises a first part and a second part, the first part and the second part of the second display area being disposed on two sides of the first display area respectively, the first part and the second part of the third display area being disposed on two sides of the opening respectively;

the display area further comprises a fourth display area on a side of the opening close to the source driver, and a first part and a second part of a fifth display area on two sides of the fourth display area respectively;

gate lines in the fourth display area run through the fifth display area; and the data lines in the second display area run through the third display area and the fifth display area.

5. The array substrate according to claim 4, wherein the data lines in the first display area are connected in one-to-one correspondence with data lines in the first part and the second part of the second display area.

6. The array substrate according to claim 4, wherein a portion of the data lines in the first display area are connected in one-to-one correspondence with data lines in the first part of the second display area, and the remaining portion of the data lines in the first display area are connected in one-to-one correspondence with data lines in the second part of the second display area.

7. The array substrate according to claim 4, wherein one end of each gate line in the first display area close to the first side is connected to the first gate driver, the other end of the gate line in the first display close to the second side is connected to the second gate driver;

gate lines in the second display area, the third display area, and the fifth display area close to the first side are connected to the first gate driver; and gate lines in the second display area, the third display area, and the fifth display area close to the second side are connected to the second gate driver.

8. The array substrate according to claim 1, wherein the opening is configured to accommodate a functional component.

9. The array substrate according to claim 8, wherein the functional component is selected from a group comprising a camera and an earpiece.

10. A driving method for an array substrate according to claim 1, comprising:

providing a scan signal row by row to the gate lines in the second display area, and providing a data signal to the data lines in the second display area;

providing a scan signal row by row to the gate lines in the first display area; and providing a data signal to the data lines in the first display area via the data lines in the second display area.

11. The driving method for an array substrate according to claim 10, wherein the display area further comprises a third display area adjacent to the opening along the first direction, the data lines in the second display area running through the third display area, the driving method further comprises providing a scan signal row by row to gate lines in the third display area, and providing a data signal to data lines in the third display area.

12. The driving method for an array substrate according to claim 11, wherein the second display area comprises a first part and a second part and the third display area comprises a first part and a second part, the first part and the second part of the second display area being disposed on two sides of the first display area respectively, the first part and the second part of the third display area being disposed on two sides of the opening respectively;

the display area further comprises a fourth display area on a side of the opening close to the source driver, and a first part and a second part of a fifth display area on two sides of the fourth display area respectively;

gate lines in the fourth display area run through the fifth display area; and the data lines in the second display area run through the third display area and the fifth display area;

the driving method comprises:

providing a scan signal row by row to the gate lines in the second display area, the third display area, the fourth display area and the fifth display area, and providing a data signal to the data lines in the second display area, the third display area, the fourth display area and the fifth display area;

providing a scan signal row by row to the gate lines in the first display area; and providing a data signal to the data lines in the first display area via the data lines in the second display area.

13. A display device comprising the array substrate according to claim 1.

14. The display device according to claim 13, wherein the peripheral area further comprises connection lines, the connection lines are configured to connect the data lines in the first display area and the data lines in the second display area in one-to-one correspondence.

15. The display device according to claim 13, wherein the display area further comprises a third display area adjacent to the opening along the first direction, the data lines in the second display area running through the third display area.

16. The display device according to claim 15, wherein the display area the second display area comprises a first part and a second part and the third display area comprises a first part and a second part, the first part and the second part of the second display area being disposed on two sides of the first display area respectively, the first part and the second part of the third display area being disposed on two sides of the opening respectively;

the display area further comprises a fourth display area on a side of the opening close to the source driver, and a first part and a second part of a fifth display area on two sides of the fourth display area respectively;

gate lines in the fourth display area run through the fifth display area; and the data lines in the second display area run through the third display area and the fifth display area.

17. The display device according to claim 16, wherein the data lines in the first display area are connected in one-to-one correspondence with data lines in the first part and the second part of the second display area.

\* \* \* \* \*